United States Patent [19]
Kushiya et al.

[11] Patent Number: 5,981,868
[45] Date of Patent: Nov. 9, 1999

[54] THIN-FILM SOLAR CELL COMPRISING THIN-FILM LIGHT ABSORBING LAYER OF CHALCOPYRITE MULTI-ELEMENT COMPOUND SEMICONDUCTOR

[75] Inventors: Katsumi Kushiya; Muneyori Tachiyuki; Takahisa Kase, all of Tokyo, Japan

[73] Assignee: Showa Shell Sekiyu K.K., Tokyo, Japan

[21] Appl. No.: 08/841,690

[22] Filed: Apr. 30, 1997

[30] Foreign Application Priority Data

Oct. 25, 1996 [JP] Japan .................................. 8-299791

[51] Int. Cl.⁶ ...................... H01L 31/0336; H01L 31/032
[52] U.S. Cl. ......................... 136/262; 136/265; 136/256; 136/255; 257/148; 257/200; 257/201; 257/431; 257/464; 257/441; 257/65
[58] Field of Search ..................................... 136/262, 265, 136/256, 255; 257/184, 200, 201, 431, 464, 441, 65

[56] References Cited

U.S. PATENT DOCUMENTS

| | | | |
|---|---|---|---|
| 4,335,266 | 6/1982 | Mickelsen et al. | 136/260 |
| 4,798,660 | 1/1989 | Ermer et al. | 204/192.17 |
| 4,915,745 | 4/1990 | Pollock et al. | 136/265 |
| 5,078,803 | 1/1992 | Pier et al. | 136/256 |
| 5,078,804 | 1/1992 | Chen et al. | 136/260 |
| 5,141,564 | 8/1992 | Chen et al. | 136/258 |
| 5,474,939 | 12/1995 | Pollock et al. | 136/264 |

FOREIGN PATENT DOCUMENTS 4-326526  11/1992  Japan .

OTHER PUBLICATIONS

Katsumi Kushiya et al., *25th IEEE Photovoltaics Specialists Conference*, "The Role of Cu(InGa)(SeS)₂ Surface Layer On A Graded Band–Gap Cu(InGa)Se₂ Thin–Film Solar Cell Prepared By Two–Stage Method", May 13–17, 1996.
Kushiya et al., "Development of Cu(InGa)Se₂ Thin–Film Solar Cells With Zn–Compound Buffer," *13th European Photovoltaic Solar Energy Conference Proceedings*, Oct. 23–27, 1995, pp. 2016–2019.
Kushiya et al., "Formation Chemistry of Polycrystalline Cu(InGa)Se₂ thin–film absorber prepared by selenization Cu–Ga/In stacked precursor layers with H₂Se gas," Thin Film for Photovoltaic and Related Device Applications Symposium, Apr. 8–11, 1996, pp. 117–182.
Kushiya et al., "The Role of Cu(InGa)(SeS)₂ Surface layer on a Graded Band–Gap Cu(InGa)Se₂ Thin–Film Solar Cell Prepared By Two–Stage Method," *25th IEEE Photovoltaic Specialists Conference Proceedings*, May 13–17, 1996, pp. 989–992.
Devaney et al, IEEE Transactions on Electron Devices, vol. 37, No. 2, "Structure and Properties of High Efficiency ZnO/CdZnS/CuInGaSe2 Solar Cells", Feb. 1990.
Kushiya et al, 25th IEEE Photovoltaics Specialists Conference, The Role of Cu(InGa)(SeS)2 Surface Layer on a Graded Band–Gap Cu(InGa)Se2 Thin–Film Solar Cells Prepared by Two–Stage Method, May 1996.

*Primary Examiner*—Alan Diamond
*Attorney, Agent, or Firm*—Sughrue, Mion, Zinn, Macpeak & Seas, PLLC

[57] ABSTRACT

A solar cell with a heightened open-circuit voltage and improved junction quality of the interface between an interfacial layer (or buffer layer) and a thin-film light absorbing layer is disclosed. A thin-film solar cell is fabricated on a glass substrate and includes a metallic back electrode, a light absorbing layer, an interfacial layer, a window layer, and an upper electrode. The solar cell is characterized by the light absorbing layer. The light absorbing layer is a thin film of p-type Cu(InGa)Se₂ (CIGS) of the Cu-III-VI₂ chalcopyrite structure and has such a gallium concentration gradient that the gallium concentration gradually (gradationally) increases from the surface thereof to the inside, thereby attaining a heightened open-circuit voltage. The light absorbing layer has on its surface an ultrathin-film surface layer of Cu(InGa)(SeS)₂ (CIGSS), which has such a sulfur concentration gradient that the sulfur concentration abruptly decreases from the surface thereof (i.e., from the interfacial layer side) to the inside, thereby improving interfacial junction characteristics.

8 Claims, 5 Drawing Sheets

- • : Cu-Ga ALLOY TARGET WITH Ga CONTENT OF 10 wt% (1) AND In TARGET (3).
- △ : Cu-Ga ALLOY TARGET WITH Ga CONTENT OF 20 wt% (1) AND In TARGET (3).
- ○ : Cu-Ga ALLOY TARGET WITH Ga CONTENT OF 30 wt% (1) AND In TARGET (3).

THIN-FILM SOLAR CELLS HAVING A THIN CIGS LIGHT ABSORBING LAYER FORMED FROM A Cu-Ga TARGET WITH Ga CONTENT OF 20 wt%

THIN-FILM SOLAR CELL COMPRISING THIN-FILM LIGHT ABSORBING LAYER OF CHALCOPYRITE MULTI-ELEMENT COMPOUND SEMICONDUCTOR

FIELD OF THE INVENTION

The present invention relates to a thin-film heterojunction solar cell employing a thin film of a multi-element compound semiconductor as a light absorbing layer, in particular a thin-film solar cell which contains a thin-film light absorbing layer comprising a multi-element compound semiconductor of the Cu-III-VI$_2$ chalcopyrite structure, e.g., a p-type semiconductor such as copper indium gallium diselenide [Cu(InGa)Se$_2$, hereinafter referred to as "CIGS"], and has a p-n heterojunction.

BACKGROUND OF THE INVENTION

Thin-film solar cells of the above-described type have possibilities for extensive practical use, as described in U.S. Pat. No. 4,335,226 (issued to Michelsen et al. on Jun. 15, 1982).

Such thin-film solar cells having a high conversion efficiency are disclosed in, e.g., U.S. Pat. Nos. 4,798,660 (issued to J. H. Ermer et al.) and 4,915,745 (issued to G. A. Pollock et al.); C. L. Jensen et al., *Proceedings 23rd Photovoltaic Specialists Conference*, (1993) p. 577; and JP-A-4-326526 (Mitsune et al.). (The term "JP-A" as used herein means an "unexamined published Japanese patent application.")

C. L. Jensen et al. suggested in the reference cited above that the CuInSe$_2$ (hereinafter referred to as "CIS") light absorbing layer formed by heating a stacked precursor film comprising a copper-gallium alloy layer containing gallium and an indium layer in a selenium atmosphere has improved adhesion to a metallic back electrode layer of molybdenum (Mo) because of the segregation of gallium and migration thereof to the metallic back electrode layer during the heat treatment, and that there is the possibility that the light absorbing layer formed has an internal structure having a gallium concentration gradient and made up of two layers, i.e., a CIGS layer and a CIS layer, based on the results of Auger electron spectroscopy (AES).

SUMMARY OF THE INVENTION

In the conventional thin-film heterojunction solar cells employing a thin film of a multi-element compound semiconductor as a light absorbing layer, there has been a desire for further improvements in power generation efficiency and in interfacial junction characteristics. The present invention has been achieved in order to eliminate the problems described above. An object of the present invention is to heighten open-circuit voltage and improve interfacial junction characteristics, which is important from the standpoints of attaining a high conversion efficiency and enhancing suitability for practical use.

To accomplish the above and other objects, the present invention provides a thin-film solar cell comprising: a metallic back electrode layer; a first thin semiconductor film of a Cu(InGa)Se$_2$ multi-element compound of chalcopyrite structure formed on the metallic back electrode layer, having p-type conductivity, and serving as a thin-film light absorbing layer; a second thin semiconductor film of a transparent conductive metal oxide formed over the thin-film light absorbing layer, having a wide bandgap width and n-type conductivity, and serving as a window layer and an electrode; and a thin transparent semiconductor film with high resistance deposited between the first thin semiconductor film of a Cu-III-VI$_2$ chalcopyrite multi-element compound and the second thin semiconductor film of a conductive transparent metal oxide and serving as an interfacial layer (buffer layer).

In the thin-film solar cell of the present invention, the second thin semiconductor film of a transparent conductive metal oxide having a wide bandgap width and n-type conductivity and serving as a window layer and an electrode comprises zinc oxide containing either of boron (B) and aluminum (Al) for imparting conductivity.

In the thin-film solar cell of the present invention, the transparent interfacial layer (buffer layer) with high resistance deposited between the thin-film light absorbing layer and the window layer comprises a Group II-VI compound semiconductor containing hydroxyl groups.

In the thin-film solar cell of the present invention, the first thin semiconductor film of a Cu-III-VI$_2$ multi-element compound of chalcopyrite structure serving as a thin-film light absorbing layer is a thin film of copper indium gallium diselenide (CIGS).

In the thin-film solar cell of the present invention, the thin film of copper indium gallium diselenide (CIGS) has a thickness of from 0.5 to 3 μm.

In the thin-film solar cell of the present invention, the first thin semiconductor film of a Cu-III-VI$_2$ multi-element compound of chalcopyrite structure serving as a thin-film light absorbing layer has a gallium and indium concentration gradient such that the proportion of gallium concentration to the concentration of gallium plus indium increases from the surface of the light absorbing layer closest to the interfacial layer to the inside of the light absorbing layer.

In the thin-film solar cell of the present invention the first thin semiconductor film of a Cu-III-VI$_2$ multi-element compound of chalcopyrite structure serving as a thin-film light absorbing layer has a gallium and indium concentration gradient such that the proportion of the gallium concentration to the concentration of gallium plus indium increases from the side of the light absorbing layer closest to the interfacial layer to the inside of the light absorbing layer in the range of from 0.01 to 0.8, said proportion being from 0.01 to 0.7 on the side of the light absorbing layer closest to the interfacial layer and from 0.2 to 0.8 inside the light absorbing layer.

In the thin-film solar cell of the present invention, the first thin semiconductor film of a Cu-III-VI$_2$ multi-element compound of chalcopyrite structure serving as a thin-film light absorbing layer has on the surface thereof an ultrathin-film surface layer comprising copper indium gallium diselenide sulfide [Cu(InGa)(SeS)$_2$, hereinafter referred to as "CIGSS"] with sharp gradient from the surface.

In the thin-film solar cell of the present invention, the surface layer extends to a depth of up to 1,500 Å from the surface and consists of a sulfur-containing layer of a Cu-III-VI$_2$ chalcopyrite structure having a sulfur concentration gradient such that the concentration of sulfur therein abruptly decreases from the side closest to the interfacial layer to the inside of the light absorbing layer.

Figure 1:
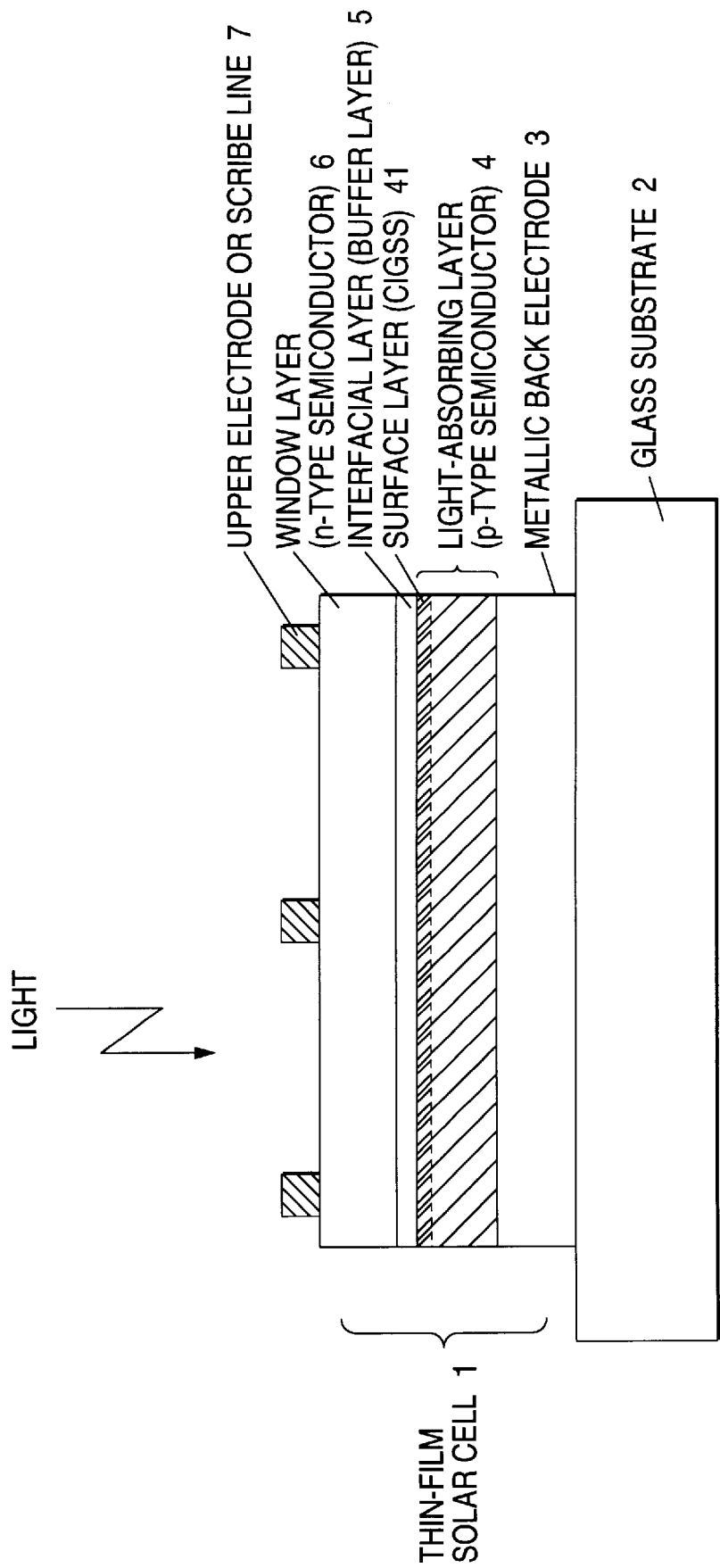
FIG. 1 is a sectional view of a thin-film solar cell according to the present invention.

wherein reference numeral 1 designates thin-film solar cell, 2 glass substrate, 3 metallic back electrode, 4 thin-film light absorbing layer (p-type semiconductor), 41 thin-film surface layer (CIGSS), 5 interfacial layer (or buffer layer), 6 window layer (n-type semiconductor), and 7 upper electrode or scribe line.

DETAILED DESCRIPTION OF THE INVENTION

Modes for carrying out the present invention are explained below by reference to the drawings.

FIG. 1 is a diagrammatic view illustrating the constitution of a thin-film solar cell of the present invention. This thin-film solar cell 1 is constituted of a metallic back electrode layer 3, a light absorbing layer (p-type semiconductor) 4 having a surface layer 41, an interfacial layer (buffer layer) 5, a window layer (n-type semiconductor) 6, and an upper electrode (or scribe lines) 7.

The thin-film solar cell 1 has been fabricated on a glass substrate 2, e.g., a soda-lime float glass having a thickness of from 1 to 3 mm. Disposed on the glass substrate 2 is the metallic back electrode layer 3, which has a thickness of from 1 to 2 $\mu$m and is made of a highly corrosion-resistant high-melting-point metal, e.g., molybdenum or titanium.

Figure 2:
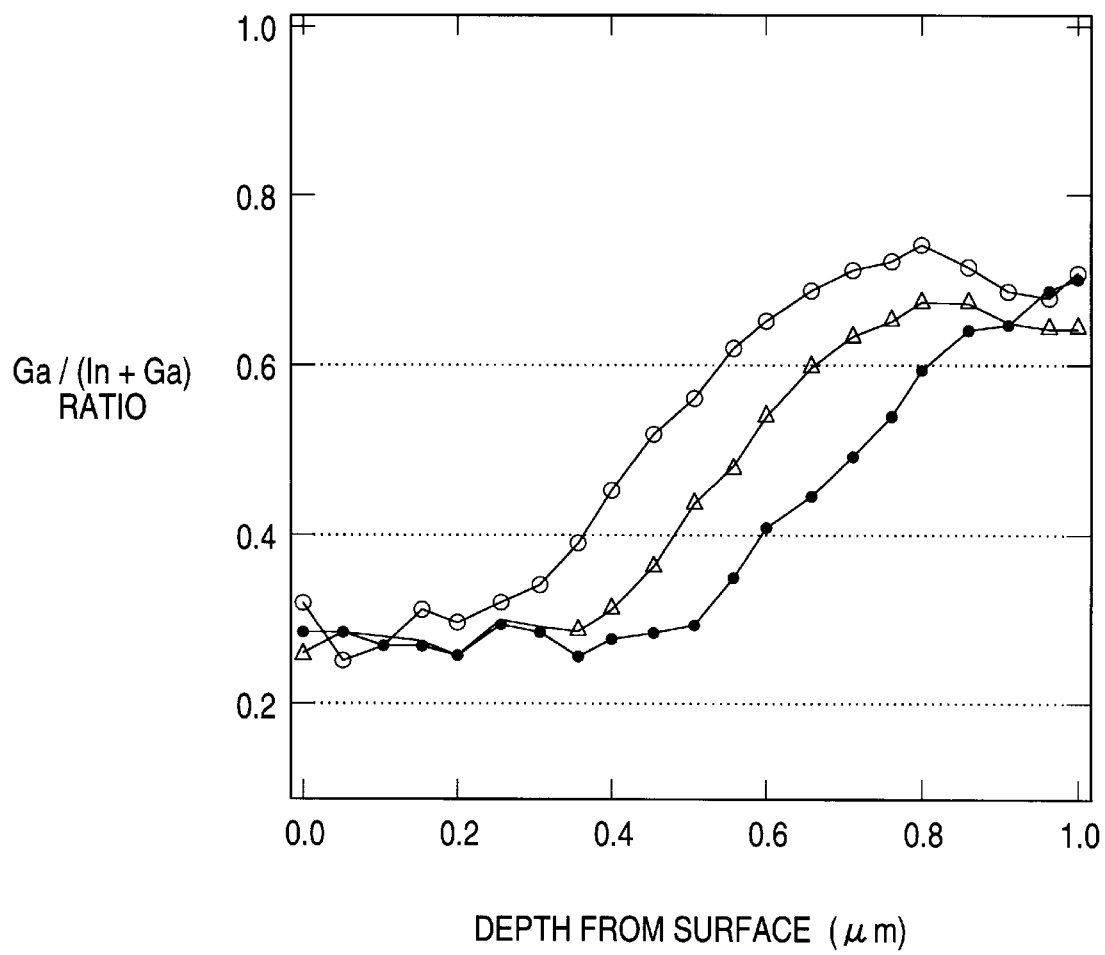
FIG. 2 is a graphical presentation illustrating the results of an examination by Auger electron spectroscopy (AES) of the distribution of the proportion of gallium concentration to the concentration of gallium plus indium in thin-film CIGS light absorbing layers for a thin-film solar cell according to the present invention.

The light absorbing layer 4 formed on the metallic back electrode layer 3 is a first thin semiconductor film, which has a thickness of from 1 to 3 $\mu$m and is made of copper indium gallium diselenide (CIGS) having the Cu-III-VI$_2$ chalcopyrite structure and p-type conductivity. It is noted that the term "Cu-III-VI$_2$" means Cu-[Group III elements]-[Group VI element(s)]$_2$. The thin-film light absorbing layer 4 has been regulated with respect to the relative concentrations of Group III elements (gallium and indium). Specifically, the light absorbing layer 4 has such a gallium concentration gradient that the proportion of gallium concentration to the concentration of gallium plus indium in the region extending from the surface layer thereof to the metallic back electrode layer (molybdenum) gradually (gradationally) increases from the surface thereof to the inside in the range of from 0.01 to 0.8, and that the proportion thereof is from 0.01 to 0.7 on the surface layer side and from 0.2 to 0.8 on the side of the metallic back electrode layer (molybdenum). Examples of this gallium concentration gradient are shown in FIG. 2.

The light absorbing layer 4 has the surface layer 41 which is an ultrathin film formed on the surface thereof. The surface layer 41 extends to a depth of up to 1,500 Å from the surface thereof, and is made of copper indium gallium diselenide sulfide (CIGSS), which is a composition having such a sulfur concentration gradient that the concentration of sulfur in the surface layer 41 abruptly decreases from the surface of the thin-film surface layer (CIGSS) (i.e., from the side of the interfacial layer (buffer layer)) to the inside.

On the light absorbing layer 4 described above is formed as the buffer layer (interfacial layer) 5 a thin-film transparent Group II-VI compound semiconductor with high resistance which may contain a hydroxide (e.g., Zn(O,S, OH)$_x$). On the buffer layer 5 is formed as the window layer 6 a second thin semiconductor film, which is a thin film of a transparent conductive metal oxide semiconductor having n-type conductivity and a wide bandgap width over 3 eV, has a thickness of from 0.5 to 3 $\mu$m, and is made of ZnO containing boron or aluminum as a dopant. The upper electrode or scribe lines 7 are formed, according to need, on the exposed surface of the window layer 6, comprising ZnO having n-type conductivity.

In the present invention, the metallic back electrode layer, the light absorbing layer, the buffer layer, and the window layer which constitute the solar cell each has a film thickness of from 5,000 to 15,000 Å, from 10,000 to 30,000 Å, from 100 to 1,000 Å, and from 5,000 to 20,000 Å, respectively.

FIG. 2 shows the results of an analysis by Auger electron spectroscopy (AES) of the distribution of the proportion of gallium concentration to the concentration of gallium plus indium in thin-film CIGS light absorbing layers obtained by the processes described below.

Symbol ● indicates the thin-film CIGS light absorbing layer 4 formed by the heat treatment in a selenium atmosphere of a stacked precursor film formed by depositing a copper-gallium alloy layer and a pure indium layer in this order on the metallic back electrode layer 3 by sputtering using a copper-gallium alloy target having a gallium content of 10% by weight and an indium target.

Symbol Δ indicates the thin-film CIGS light absorbing layer 4 formed by the heat treatment in a selenium atmosphere of a stacked precursor film formed by depositing a copper-gallium alloy layer and a pure indium layer in this order on the metallic back electrode layer 3 by sputtering using a copper-gallium alloy target having a gallium content of 20% by weight and an indium target.

Symbol ○ indicates the thin-film CIGS light absorbing layer 4 formed by the heat treatment in a selenium atmosphere of a stacked precursor film formed by depositing a copper-gallium alloy layer and a pure indium layer in this order on the metallic back electrode layer 3 by sputtering using a copper-gallium alloy target having a gallium content of 30% by weight and an indium target.

Figure 3:
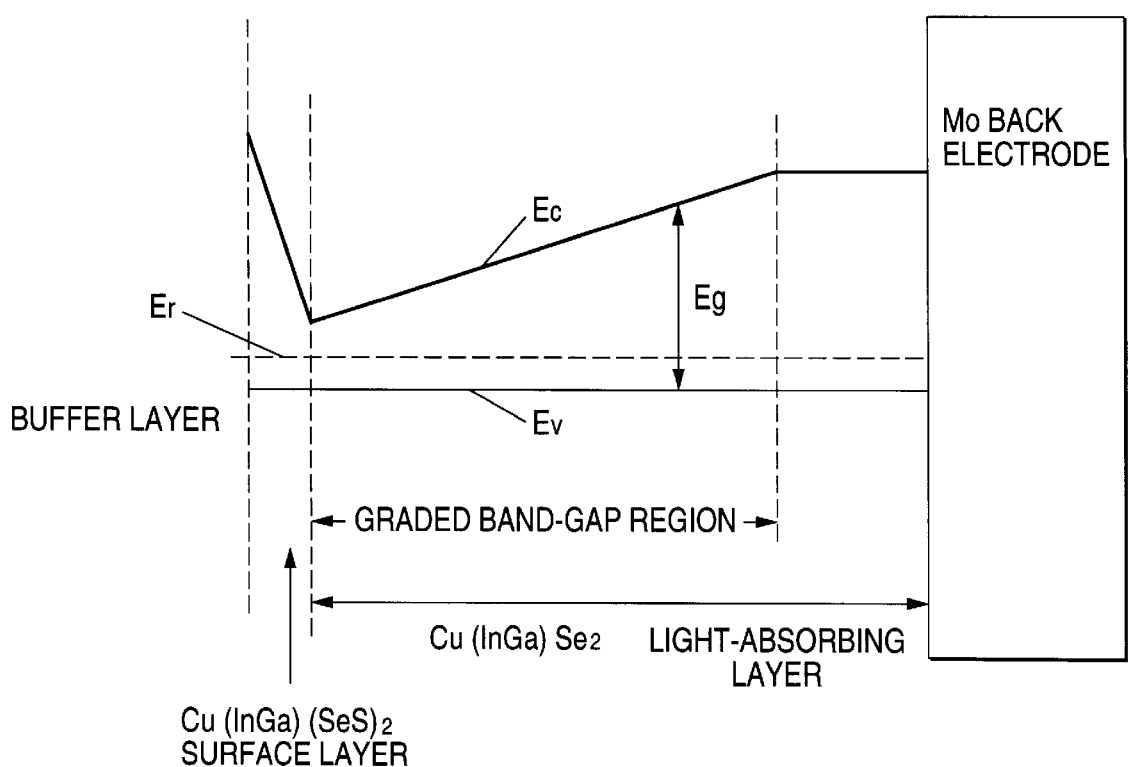
FIG. 3 is a schematic view illustrating the structure of the bandgap of the thin-film light absorbing layer of a thin-film solar cell according to the present invention.

FIG. 3 is a schematic view illustrating the structure of the bandgap of the thin-film light absorbing layer of a thin-film solar cell according to the present invention.

The thin-film CIGS light absorbing layer of the thin-film solar cell according to the present invention has the structure shown by the schematic view. This thin-film CIGS light absorbing layer 4 has an ultrathin-film CIGSS surface layer 41 formed on the surface thereof. This ultrathin-film surface layer 41 consists of a composition having such a sulfur concentration gradient that the concentration of sulfur therein abruptly decreases from the surface of the thin-film surface layer (CIGSS) (i.e., from the side of the interfacial layer (buffer layer)) to the inside. The term "ultrathin-film" as used herein generally has a film thickness of 500 Å or less.

Figure 4:
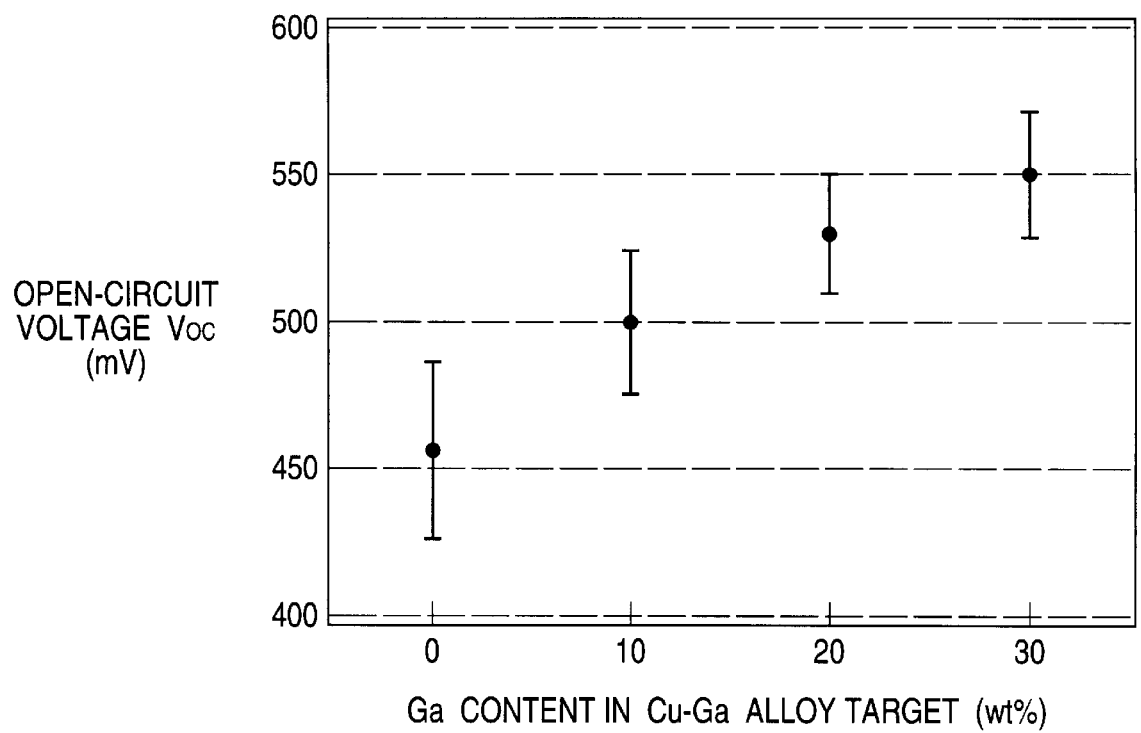
FIG. 4 is a graphical presentation illustrating the relationship between the content of gallium (wt %) in copper-gallium alloy targets and open-circuit voltage $V_{oc}$ (mV) in thin-film solar cells of the present invention which employ a thin-film CIGS light absorbing layer.

FIG. 4 shows the relationship between the content of gallium (wt %) in copper-gallium alloy targets and open-circuit voltage $V_{cc}$ (mV) in thin-film solar cells 1 employing the thin-film CIGS light absorbing layer 4 indicated by ● in FIG. 2, which layer had been produced by the heat treatment in a selenium atmosphere of a stacked precursor film formed by depositing a copper-gallium alloy layer and a pure indium layer in this order on the metallic back electrode layer 3 by sputtering using a copper-gallium alloy target having a gallium content of 0 to 30% by weight and an indium target. The results given in the figure were obtained with a solar simulator with respect to a thin-film solar module having an aperture area of 50 cm$^2$ under the standard measurement condition of air mass (AM) 1.5 and 100 mW/cm$^2$. The results obtained show that high open-circuit voltages $V_{oc}$ exceeding 500 mV can be obtained, which are comparable to those of polycrystalline-silicon solar cells.

The above results indicate that a widened forbidden band and a heightened open-circuit voltage can be obtained by regulating the thin-film light absorbing layer 4 so as to have a composition having a gallium concentration gradient such as that shown by ● in FIG. 2, namely, such a gradient that the concentration of gallium in the layer increases from the surface thereof to the inside.

Figure 5:
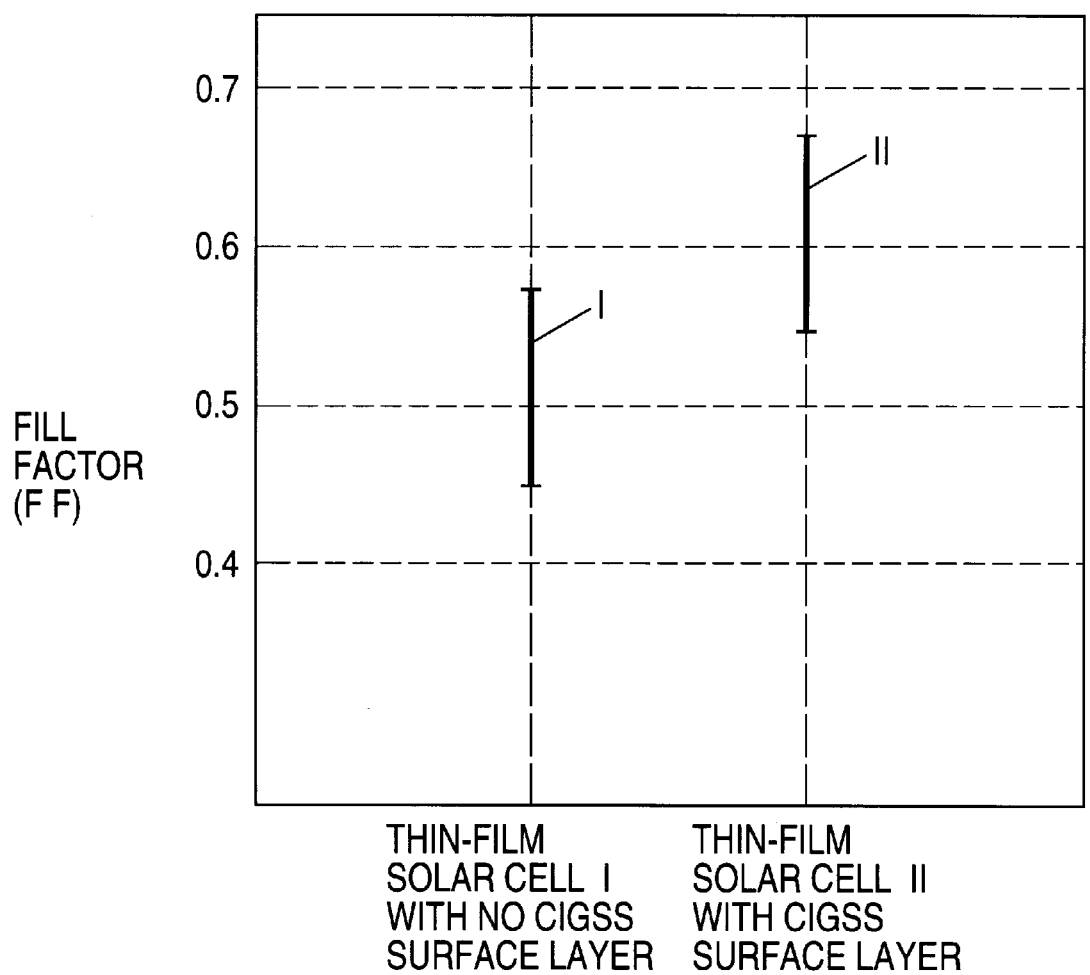
FIG. 5 is a graphical presentation illustrating the results of an examination for fill factor [FF] of thin-film solar cell II of the present invention which has a CIGSS surface layer and thin-film solar cell I having no CIGSS surface layer.

FIG. 5 shows the results of an examination for fill factor [FF] of thin-film solar cells 1 having the thin-film CIGS light absorbing layer 4 shown by Δ in FIG. 2, which layer had been produced by the heat treatment in a selenium atmosphere of a stacked precursor film formed by depositing a copper-gallium alloy layer and a pure indium layer in this order on the metallic back electrode layer 3 by sputtering using a copper-gallium alloy target having a gallium content of 20% by weight and an indium target. In FIG. 5, I denotes the thin-film solar cell having no CIGSS surface layer 41, and II denotes that cell having the CIGSS surface layer 41.

The experimental results given in FIG. 5 show that thin-film solar cell II, having the CIGSS surface layer 41, had a higher fill factor [FF] than thin-film solar cell I, having no CIGSS surface layer 41.

Fill factor [FF] is a measure to evaluate interfacial junction characteristics in solar cells. As apparent from FIG. 5, the interface between the interfacial layer (or buffer layer) 5 and the thin-film light absorbing layer 4 can have greatly improved p-n hetero-junction characteristics due to the ultrathin-film surface layer 41 of the light absorbing layer 4 in the present invention.

By regulating the thin-film light absorbing layer 4 so as to have an internal structure having a gallium concentration gradient in which the concentration of gallium gradually (gradationally) increases from the surface thereof to the inside as shown in FIG. 2, the bandgap of the light absorbing layer can be graded and a heightened open-circuit voltage $V_{oc}$ can be obtained.

By regulating the ultrathin-film surface layer 41 of the light absorbing layer 4 so as to extend to a depth of up to 1,500 Å from the surface and to consist of a composition having a sulfur concentration gradient in which the concentration of sulfur abruptly decreases from the surface of the thin-film surface layer (CIGSS) (i.e., from the side of the interfacial layer (buffer layer)) to the inside, the p-n hetero-junction characteristics of the interface between the interfacial layer (or buffer layer) 5 and the thin-film light absorbing layer 4 can be greatly improved.

While the invention has been described in detail and with reference to specific embodiments thereof, it will be apparent to one skilled in the art that various changes and modifications can be made therein without departing from the spirit and scope thereof.

What is claimed is:

1. A thin-film solar cell comprising a thin-film light absorbing layer of a Cu-III-VI$_2$ chalcopyrite-structured multi-element compound semiconductor, wherein said solar cell comprises: a metallic back electrode layer; a first thin semiconductor film of a Cu-III-VI$_2$ multi-element compound of chalcopyrite structure formed on the metallic back electrode layer, having p-type conductivity, and serving as a thin-film light absorbing layer; a second thin semiconductor film of a transparent conductive metal oxide formed over the thin-film light absorbing layer, having a wide bandgap width and n-type conductivity, and serving as a window layer and an electrode; and a thin transparent semiconductor film with high resistance deposited between the first thin semiconductor film of a Cu-III-VI$_2$ chalcopyrite multi-element compound and the second thin semiconductor film of a conductive transparent metal oxide and serving as an interfacial layer;

wherein the first thin semiconductor film of a Cu-III-VI$_2$ multi-element compound of chalcopyrite structure serving as a thin-film light absorbing layer has on the surface thereof closest to the interfacial layer an ultrathin-film surface layer comprising copper indium gallium diselenide sulfide.

2. The thin-film solar cell comprising a thin-film light absorbing layer of a Cu-III-VI$_2$ multi-element compound semiconductor of chalcopyrite structure as claimed in claim 1, wherein the second thin semiconductor film of a transparent conductive metal oxide having a wide bandgap width and n-type conductivity and serving as a window layer and an electrode comprises zinc oxide containing either of boron and aluminum for imparting conductivity.

3. The thin-film solar cell comprising a thin-film light absorbing layer of a Cu-III-VI$_2$ multi-element compound semiconductor of chalcopyrite structure as claimed in claim 1, wherein the transparent interfacial layer with high resistance deposited between the thin-film light absorbing layer and the window layer comprises a Group II-VI compound semiconductor containing hydroxyl groups.

4. The thin-film solar cell comprising a thin-film light absorbing layer of a Cu-III-VI$_2$ multi-element compound semiconductor of chalcopyrite structure as claimed in claim 1, wherein the first thin semiconductor film of a Cu-III-VI$_2$ multi-element compound of chalcopyrite structure serving as a thin-film light absorbing layer is a thin film of copper indium gallium diselenide.

5. The thin-film solar cell comprising a thin-film light absorbing layer of a Cu-III-VI$_2$ multi-element compound semiconductor of chalcopyrite structure as claimed in claim 4, wherein the thin film of copper indium gallium diselenide has a thickness of from 0.5 to 3 $\mu$m.

6. The thin-film solar cell comprising a thin-film light absorbing layer of a Cu-III-VI$_2$ multi-element compound semiconductor of chalcopyrite structure as claimed in claim 4, wherein the first thin semiconductor film of a Cu-III-VI$_2$ multi-element compound of chalcopyrite structure serving as a thin-film light absorbing layer has a gallium and indium concentration gradient such that the proportion of the gallium concentration to the concentration of gallium plus indium increases from the surface of the light absorbing layer closest to the interfacial layer to the inside of the light absorbing layer.

7. The thin-film solar cell comprising a thin-film light absorbing layer of a Cu-III-VI$_2$ multi-element compound semiconductor of chalcopyrite structure as claimed in claim 4, wherein the first thin semiconductor film of a Cu-III-VI$_2$ multi-element compound of chalcopyrite structure serving as a thin-film light absorbing layer has a gallium and indium concentration gradient such that the proportion of the gallium concentration to the concentration of gallium plus indium increases from the side of the light absorbing layer closest to the interfacial layer to the inside of the light absorbing layer in the range of from 0.01 to 0.8, said proportion being from 0.01 to 0.7 on the side of the light absorbing layer closest to the interfacial layer and from 0.2 to 0.8 inside the light absorbing layer.

8. The thin-film solar cell comprising a thin-film light absorbing layer of a $Cu$-$III$-$VI_2$ multi-element compound semiconductor of chalcopyrite structure as claimed in claim 2, wherein the light absorbing layer has a surface layer which extends to a depth of up to 1,500 Å from the surface closest to the interfacial layer and consists of a sulfur-containing layer of a $Cu$-$III$-$VI_2$ chalcopyrite structure having a sulfur concentration gradient such that the concentration of sulfur therein abruptly decreases from the side closest to the interfacial layer to the inside of the light absorbing layer.

* * * * *